(12) United States Patent
Shen et al.

(10) Patent No.: US 6,677,180 B2
(45) Date of Patent: Jan. 13, 2004

(54) METHOD FOR MANUFACTURING A LOW-PROFILE SEMICONDUCTOR DEVICE

(76) Inventors: Ming-Tung Shen, 4F, No. 52, Sec. 2, Chung Shan N. Rd., Taipei City (TW); I-Ming Chen, 4F, No. 52, Sec. 2, Chung Shan N. Rd., Taipei City (TW)

( * ) Notice: Subject to any disclaimer, the term of this patent is extended or adjusted under 35 U.S.C. 154(b) by 10 days.

(21) Appl. No.: 10/338,986

(22) Filed: Jan. 8, 2003

(65) Prior Publication Data

US 2003/0098471 A1 May 29, 2003

Related U.S. Application Data

(62) Division of application No. 10/001,040, filed on Nov. 3, 2001.

(30) Foreign Application Priority Data

Jan. 19, 2001 (TW) ........................................ 90101277 A

(51) Int. Cl.$^7$ ............................................... H01L 21/44
(52) U.S. Cl. ........................ 438/108; 257/666; 257/669; 257/671; 257/686
(58) Field of Search ................................. 257/666, 669, 257/671, 686

(56) References Cited

U.S. PATENT DOCUMENTS

| 5,917,235 A | 6/1999 | Imura |
| 6,133,637 A | 10/2000 | Hikita et al. |
| 6,425,516 B1 | 7/2002 | Iwatsu et al. |

*Primary Examiner*—David Nelms
*Assistant Examiner*—Mai-Huong Tran

(57) ABSTRACT

A method for manufacturing a semiconductor device includes the steps of forming a first conductive bump on a substrate, forming a second conductive bump on a semiconductor chip, forming a plurality of spaced apart dielectric supporting pads on one of the substrate and the semiconductor chip, mounting the semiconductor chip on the substrate to confine therebetween a gap, bonding together the first and second conductive bumps, and forming an insulating layer that fills in the gap and that encapsulates the supporting pads and the first and second conductive bumps.

18 Claims, 4 Drawing Sheets

METHOD FOR MANUFACTURING A LOW-PROFILE SEMICONDUCTOR DEVICE

CROSS-REFERENCE TO RELATED APPLICATION

This application is a divisional of U.S. patent application Ser. No. 10/001,040, filed Nov. 3, 2001.

This application claims priority of Taiwan patent Application No. 90101277, filed on Jan. 19, 2001.

BACKGROUND OF THE INVENTION

1. Field of the Invention

This invention relates to a method for manufacturing a low-profile semiconductor device.

2. Description of the Related Art

The sizes of semiconductor chips can vary widely with different chip packaging techniques. With the rapid advancement in electronic devices, minimization of profiles of semiconductor chips has been a major concern of manufactures. For instance, the profiles of Flip-Chips can be made relatively low by current packaging techniques. However, there is still a need to further reduce the profiles of the Flip-Chips.

SUMMARY OF THE INVENTION

Therefore, the main object of the present invention is to provide a method for manufacturing a low-profile semiconductor device.

Another object of the present invention is to provide a low-profile semiconductor device.

Yet another object of the present invention is to provide a method for forming a conductive bump on a bonding pad on a pad-mounting surface of a semiconductor chip so as to reduce the profile of a semiconductor device that includes the semiconductor chip.

Still another object of the present invention is to provide a semiconductor device with a conductive bump that can lead to a reduced profile for the semiconductor device.

According to one aspect of the present invention, there is provided a method for manufacturing a semiconductor device that includes a semiconductor chip and a substrate. The substrate has a chip-mounting surface provided with a plurality of contact pads. The semiconductor chip has a pad-mounting surface provided with a plurality of bonding pads which are to be connected to corresponding ones of the contact pads. The method comprises the steps of: forming a first conductive bump on each of the contact pads of the substrate; forming a second conductive bump on each of the bonding pads of the semiconductor chip; forming a plurality of spaced apart dielectric supporting pads on a selected one of the chip-mounting surface of the substrate and the pad-mounting surface of the semiconductor chip at positions offset from the first and second conductive bumps; mounting the semiconductor chip on the substrate to confine therebetween a gap and to permit each of the first conductive bumps to be vertically registered with and to contact a respective one of the second conductive bumps and to permit the supporting pads to interconnect the chip-mounting surface and the pad-mounting surface; reflowing the first and second conductive bumps in a manner that each of the first conductive bumps is bonded to the respective one of the second conductive bumps; and forming an insulating layer that fills in the gap and that encapsulates the supporting pads and the first and second conductive bumps.

According to another aspect of the present invention, a semiconductor device comprises: a substrate having a chip-mounting surface provided with a plurality of contact pads and a plurality of first conductive bumps formed respectively on the contact pads; a semiconductor chip having a pad-mounting surface provided with a plurality of bonding pads and a plurality of second conductive bumps formed respectively on the bonding pads, the semiconductor chip being mounted on the substrate to confine therebetween a gap, the second conductive bumps being respectively registered with and being bonded to the first conductive bumps; a plurality of spaced apart dielectric supporting pads disposed in the gap at positions offset from the first and second bumps, the supporting pads interconnecting the chip-mounting surface of the substrate and the pad-mounting surface of the semiconductor chip; and an insulating layer that fills in the gap and that encapsulates the supporting pads and the first and second conductive bumps.

According to yet another aspect of the present invention, there is provided a method for forming a conductive bump on a bonding pad on a pad-mounting surface of a semiconductor chip. The method comprises the steps of: applying an adhesive layer to a central area of the bonding pad; laying a ball body on the adhesive layer, the ball body having a lower half with a lower hemisphere surface that curves upwardly from an upper surface of the adhesive layer and that cooperates with the upper surface of the adhesive layer to define a groove therebetween; and forming a conductive layer that fills the groove, that encapsulates and that is bonded to the ball body and the adhesive layer, and that covers a remaining area of the bonding pad around the central area.

According to a further aspect of the present invention, a semiconductor device comprises: a semiconductor chip having a pad-mounting surface provided with at least a bonding pad; and a conductive bump formed on the bonding pad and having an adhesive layer that covers a central area of the bonding pad, a ball body that is laid on and that is bonded to the adhesive layer, and a conductive layer that encapsulates and that is bonded to the ball body and the adhesive layer and that covers a remaining area of the bonding pad around the central area, the ball body having a lower half with a lower hemisphere surface that curves upwardly from an upper surface of the adhesive layer and that cooperates with the upper surface of the adhesive layer to define a groove therebetween, the conductive layer filling the groove.

BRIEF DESCRIPTION OF THE DRAWINGS

In drawings which illustrate embodiments of the invention.

DETAILED DESCRIPTION OF THE PREFERRED EMBODIMENTS

FIGS. 1 to 6 illustrate consecutive steps of processing a semiconductor chip 1 and a substrate 2 for forming a preferred embodiment of a semiconductor device according to the method of this invention.

Figure 1:
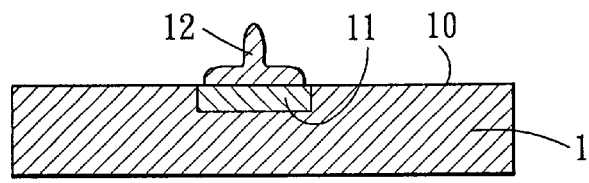
FIG. 1 is a schematic view illustrating the formation of a first conductive bump on a bonding pad on a pad-mounting surface of a semiconductor chip according to a method of this invention.
Figure 2:
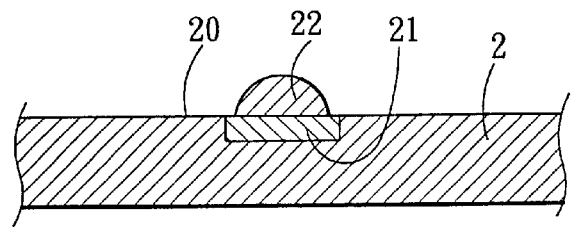
FIG. 2 is a schematic view illustrating the formation of a second conductive bump on a contact pad on a chip-mounting surface of a substrate according to the method of this invention.

Referring to FIGS. 1 and 2, the substrate 2 has a chip-mounting surface 20 provided with a plurality of contact pads 21 (only one contact pad is shown). The semiconductor chip 1 has a pad-mounting surface 10 provided with a plurality of bonding pads 11 (only one bonding pad is shown) which are to be connected to corresponding ones of the contact pads 21 on the substrate 2.

In FIG. 2, a first conductive bump 22 is formed on each of the contact pads 21 of the substrate 2 by printing techniques. The first conductive bump 22 can be a silver-containing conductive paste. The substrate 2 is preferably selected from a group consisting of non-flexible circuit boards, flexible circuit boards, circuit boards made from glass materials, and circuit boards made from plastic materials.

In FIG. 1, a second conductive bump 12 is formed on each of the bonding pads 11 of the semiconductor chip 1 by wire bonding techniques or plating techniques.

Figure 3:
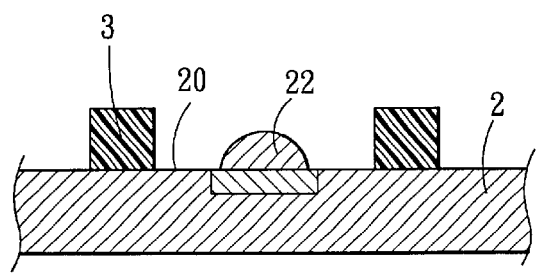
FIG. 3 is a schematic view illustrating the formation of supporting pads on the chip-mounting surface of the substrate according to the method of this invention.
Figure 4:
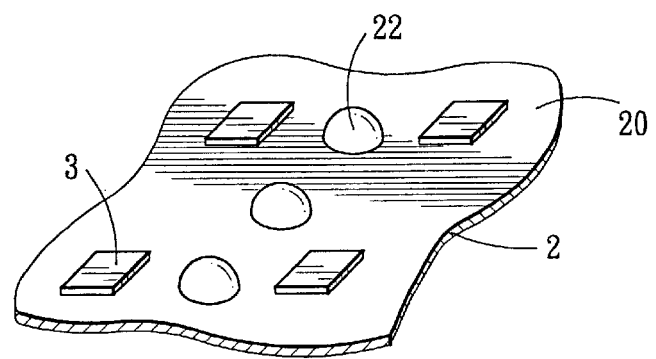
FIG. 4 is a fragmentary perspective view to illustrate distribution of the supporting pads of FIG. 3 on the substrate.

In FIGS. 3 and 4, a plurality of spaced apart dielectric supporting pads 3 are formed on the chip-mounting surface 20 of the substrate 2 at positions offset from the first conductive bumps 22. In an alternative way, the supporting pads 3 can be formed on the pad-mounting surface 10 of the semiconductor chip 1 at positions offset from the second conductive bumps 12. The supporting pads 3 have substantially the same length. The supporting pads 3 are made from a first resin material.

Figure 5:
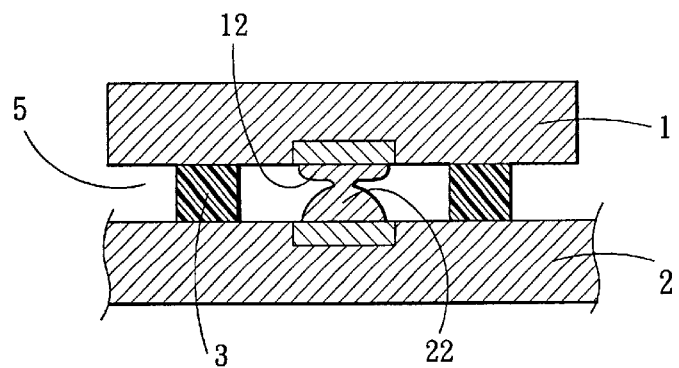
FIG. 5 is a schematic view illustrating the step of mounting the semiconductor chip of FIG. 2 on the substrate of FIG. 3 according to the method of this invention.

In FIG. 5, the semiconductor chip 1 is mounted on the substrate 2 to confine therebetween a gap 5 and to permit each of the first conductive bumps 22 to be vertically registered with and to contact a respective one of the second conductive bumps 12 and to permit the supporting pads 3 to interconnect the chip-mounting surface 20 and the pad-mounting surface 10. The first and second conductive bumps 22, 12 are reflowed in a manner that each of the first conductive bumps 22 is bonded to the respective one of the second conductive bumps 12.

Figure 6:
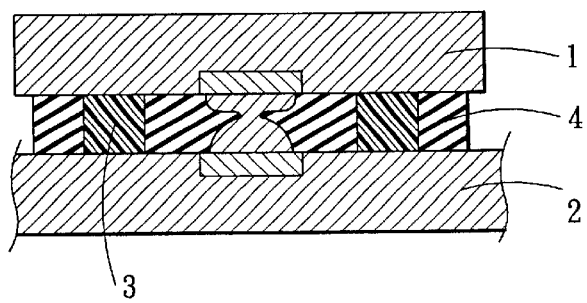
FIG. 6 is a schematic view illustrating formation of an insulating layer between the semiconductor chip of FIG. 2 and the substrate of FIG. 3 according to the method of this invention.

In FIG. 6, an insulating layer 4 is formed and fills in the gap 5, and encapsulates the supporting pads 3 and the first and second conductive bumps 22, 12. The insulating layer 4 is made from a second resin material.

Preferably, the first and second resin materials are epoxy resins. The method of this invention further includes a step of curing and hardening the supporting pads 3 and the insulating layer 4 in the gap 5 between the semiconductor chip 1 and the substrate 2.

Figure 7:
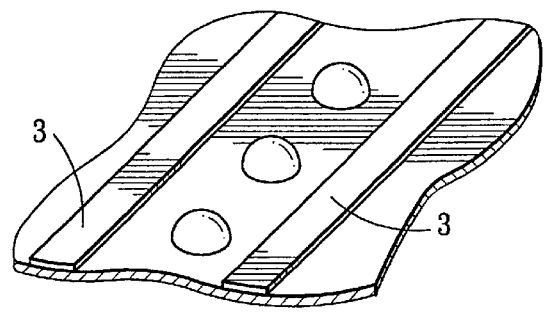
FIG. 7 is a schematic view to illustrate the supporting pads modified from those of FIG. 4.

As illustrated in FIG. 7, the supporting pads 3 can be in the form of strips as compared to the block shape of those of FIG. 4.

Figure 8:
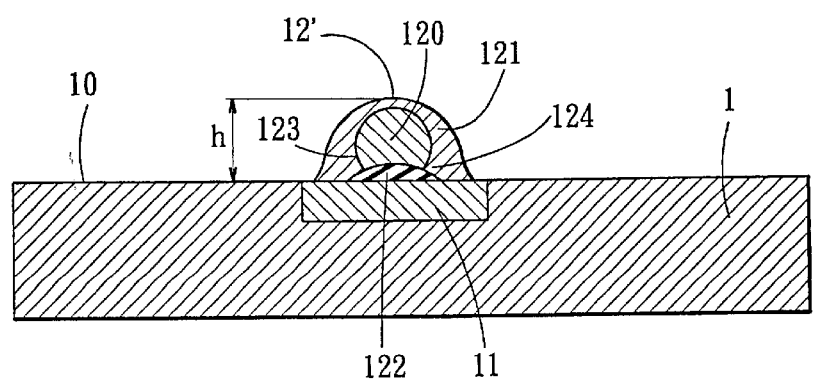
FIG. 8 is a schematic view to illustrate a modified semiconductor chip of the semiconductor device of this invention.

FIG. 8 illustrates a modified semiconductor chip 1 with a composite conductive bump 12' that can be applied to the method of this invention.

The method for forming the composite conductive bump 12' includes the steps of: applying an adhesive layer 122 to a central area of the bonding pad 11 on the pad-mounting surface 10 of the semiconductor chip 1; laying a ball body 120 on the adhesive layer 122, the ball body 120 having a lower half with a lower hemisphere surface 123 that curves upwardly from an upper surface of the adhesive layer 122 and that cooperates with the upper surface of the adhesive layer 122 to define a groove 124 therebetween; and forming a conductive layer 121 that fills the groove 124, that encapsulates and that is bonded to the ball body 120 and the adhesive layer 122, and that covers a remaining area of the bonding pad 11 around the central area. The ball body 120 and the adhesive 122 can be formed from a conductive material or a non-conductive material. The conductive layer 121 can contain a metal selected from a group consisting of Au, Ag, and Sn. The conductive layer 121 is preferably formed by sputtering techniques.

The use of the semiconductor chip 1 of FIG. 8 is advantageous in that the height (h) of the composite conductive bump 12' can be reduced to less than 75 $\mu$m and that the processing time for the formation of the composite conductive bump 12' can be reduced to about one hour as compared to those of the prior art that normally require about 20 hours to form the conductive bumps.

With the invention thus explained, it is apparent that various modifications and variations can be made without departing from the spirit of the present invention. It is therefore intended that the invention be limited only as recited in the appended claims.

We claim:

1. A method for manufacturing a semiconductor device that includes a semiconductor chip and a substrate, the substrate having a chip-mounting surface provided with a plurality of contact pads, the semiconductor chip having a pad-mounting surface provided with a plurality of bonding pads, which are to be connected to corresponding ones of the contact pads, said method comprising the steps of:

forming a first conductive bump on each of the contact pads of the substrate;

forming a second conductive bump on each of the bonding pads of the semiconductor chip;

forming a plurality of spaced apart dielectric supporting pads on a selected one of the chip-mounting surface of the substrate and the pad-mounting surface of the semiconductor chip at positions offset from the first and second conductive bumps;

mounting the semiconductor chip on the substrate to confine therebetween a gap and to permit each of the first conductive bumps to be vertically registered with and to contact a respective one of the second conductive bumps and to permit the supporting pads to interconnect the chip-mounting surface and the pad-mounting surface;

reflowing the first and second conductive bumps in a manner that each of the first conductive bumps is bonded to the respective one of the second conductive bumps; and forming an insulating layer that fills in the gap and that encapsulates the supporting pads and the first and second conductive bumps.

2. The method of claim 1, wherein the supporting pads are made from a first resin material.

3. The method of claim 2, wherein the insulating layer is made from a second resin material.

4. The method of claim 3, further comprising a step of curing and hardening the supporting pads and the insulating layer.

5. The method of claim 3, wherein the first and second resin materials are epoxy resins.

6. The method of claim 1, wherein the first conductive bumps are formed from conductive paste.

7. The method of claim 1, wherein the first conductive bumps are formed from silver-containing conductive paste.

8. The method of claim 1, wherein the substrate is selected from a group consisting of non-flexible circuit boards, flexible circuit boards, circuit boards made from glass materials, and circuit boards made from plastic materials.

9. The method of claim 1, wherein the supporting pads are formed on the chip-mounting surface of the substrate.

10. The method of claim 1, wherein the supporting pads are formed on the pad-mounting surface of the semiconductor chip.

11. The method of claim 1, wherein the second conductive bump is formed by the steps of:

applying an adhesive layer to a central area of each of the bonding pads;

laying a ball body on the adhesive layer, the ball body having a lower half with a lower hemisphere surface that curves upwardly from an upper surface of the adhesive layer and that cooperates with the upper surface of the adhesive layer to define a groove therebetween; and forming a conductive layer that fills the groove, that encapsulates and that is bonded to the ball body and the adhesive layer, and that covers a remaining area of the respective one of the bonding pads around the central area.

12. A method for forming a conductive bump on a bonding pad on a pad-mounting surface of a semiconductor chip, comprising the steps of:

applying an adhesive layer to a central area of the bonding pad;

laying a ball body on the adhesive layer, the ball body having a lower half with a lower hemisphere surface that curves upwardly from an upper surface of the adhesive layer and that cooperates with the upper surface of the adhesive layer to define a groove therebetween; and forming a conductive layer that fills the groove, that encapsulates and that is bonded to the ball body and the adhesive layer, and that covers a remaining area of the bonding pad around the central area.

13. The method of claim 12, wherein the ball body is formed from a non-conductive material.

14. The method of claim 12, wherein the ball body is formed from a conductive material.

15. The method of claim 12, wherein the adhesive layer is formed from a non-conductive material.

16. The method of claim 12, wherein the adhesive layer is formed from a conductive material.

17. The method of claim 12, wherein the conductive layer contains a metal selected from a group consisting of Au, Ag, and Sn.

18. The method of claim 17, wherein the conductive layer is formed by sputtering.

* * * * *